PUSH-BUTTON TUNER FOR RADIO RECEIVERS

Filed Jan. 19, 1945 5 Sheets-Sheet 1

INVENTOR
JOHN D. REID
BY Darby & Darby
ATTORNEY

INVENTOR
JOHN D. REID
BY Darby & Darby
ATTORNEY

May 16, 1950 J. D. REID 2,507,576

PUSH-BUTTON TUNER FOR RADIO RECEIVERS

Filed Jan. 19, 1945 5 Sheets-Sheet 3

INVENTOR
JOHN D. REID
BY Darby & Darby
ATTORNEY

PUSH-BUTTON TUNER FOR RADIO RECEIVERS

INVENTOR
JOHN D. REID
BY Darby & Darby
ATTORNEY

May 16, 1950 J. D. REID 2,507,576

PUSH-BUTTON TUNER FOR RADIO RECEIVERS

Filed Jan. 19, 1945 5 Sheets-Sheet 5

INVENTOR
JOHN D. REID

BY Darby + Darby
ATTORNEYS

Patented May 16, 1950

2,507,576

UNITED STATES PATENT OFFICE 2,507,576

PUSH-BUTTON TUNER FOR RADIO RECEIVERS

John Drysdale Reid, Mount Healthy, Ohio, assignor, by mesne assignments, to Avco Manufacturing Corporation, a corporation of Delaware Application January 19, 1945, Serial No. 573,595

28 Claims. (Cl. 250—20)

The present invention relates in general to a push-button tuner for radio receivers.

More specifically, it relates to a push-button operated receiver which permits the selection of any 10 kilocycle channel in a given band by means of push-buttons, the total number of which is considerably less than the number of channels contained in the band. For example, any 10 kilocycle channel in the broadcast band, 540 to 1590 kilocycles, which contains 106 such channels, may be selected by means of only 21 push-buttons.

With present day push-button receivers there are usually provided from about five to ten push-buttons for tuning in the more popular stations and an additional button for conditioning the receiver to be under control of the variable tuning condenser whereby other desired stations may be tuned in.

In accordance with the present invention the customary variable tuning condenser is dispensed with, as are also the tuning indicator dial and the parts associated with the condenser and dial for actuating the same. The tuning operation in the receiver according to the invention is accomplished by the selective connection of one of a plurality of semi-fixed condensers across a coil, or the selective connection of one of a plurality of coils across a condenser, or by the selective connection of both a coil and a condenser simultaneously.

It is therefore one of the objects of the invention to provide a receiver which is operated solely by push-buttons to select any 10 kilocycle channel in the broadcast, short-wave or other bands.

Another object of the invention is to provide a receiver the circuit of which utilizes a plurality of frequency converters, the oscillator portions of which and the input to the receiver being tuned by the selective connection therein of a capacitor, a coil, or both.

Another object of the invention is to provide a receiver utilizing, for example, a double conversion superheterodyne circuit in which the number of "hundreds" kilocycles, that is, 5 to 15, for the broadcast bands, is determined by the band of frequencies to which the receiver input is tuned and by the frequency to which the oscillator of the first converter is tuned and by the band of frequencies passed by the tuned circuits between the 1st and 2d converters, and the number of kilocycles in "tens" from 0 to 90 is determined by the frequency to which the oscillator of the second converter is tuned and by the frequency to which the circuits following the second converter are tuned.

Another object of the invention is to provide a receiver utilizing a triple conversion superheterodyne circuit in which the number of "thousands" of kilocycle reception is determined by the band of frequencies to which the receiver input is tuned and by the frequency to which the oscillator of the first converter is tuned and by the band of frequencies passed by the first intermediate frequency circuit; the number of "hundreds" of kilocycles is determined by the frequency to which the oscillator of the second converter is tuned and by the frequency to which the second intermediate frequency circuit is tuned; and the number of "tens" of kilocycles is determined by the frequency to which the oscillator of the third converter is tuned and by the frequency to which the third intermediate frequency circuit is tuned.

Other objects of the invention are to improve generally the simplicity and efficiency of push-button receivers so that not only would they be reliable in operation but capable also of economical manufacture and assembly.

The novel features characteristic of my invention are set forth with particularity in the appended claims. The invention itself, however, both as to its organization and mode of operation together with further objects and advantages thereof, will best be understood by reference to the following description taken in connection with the accompanying drawings in which:

Figure 3:
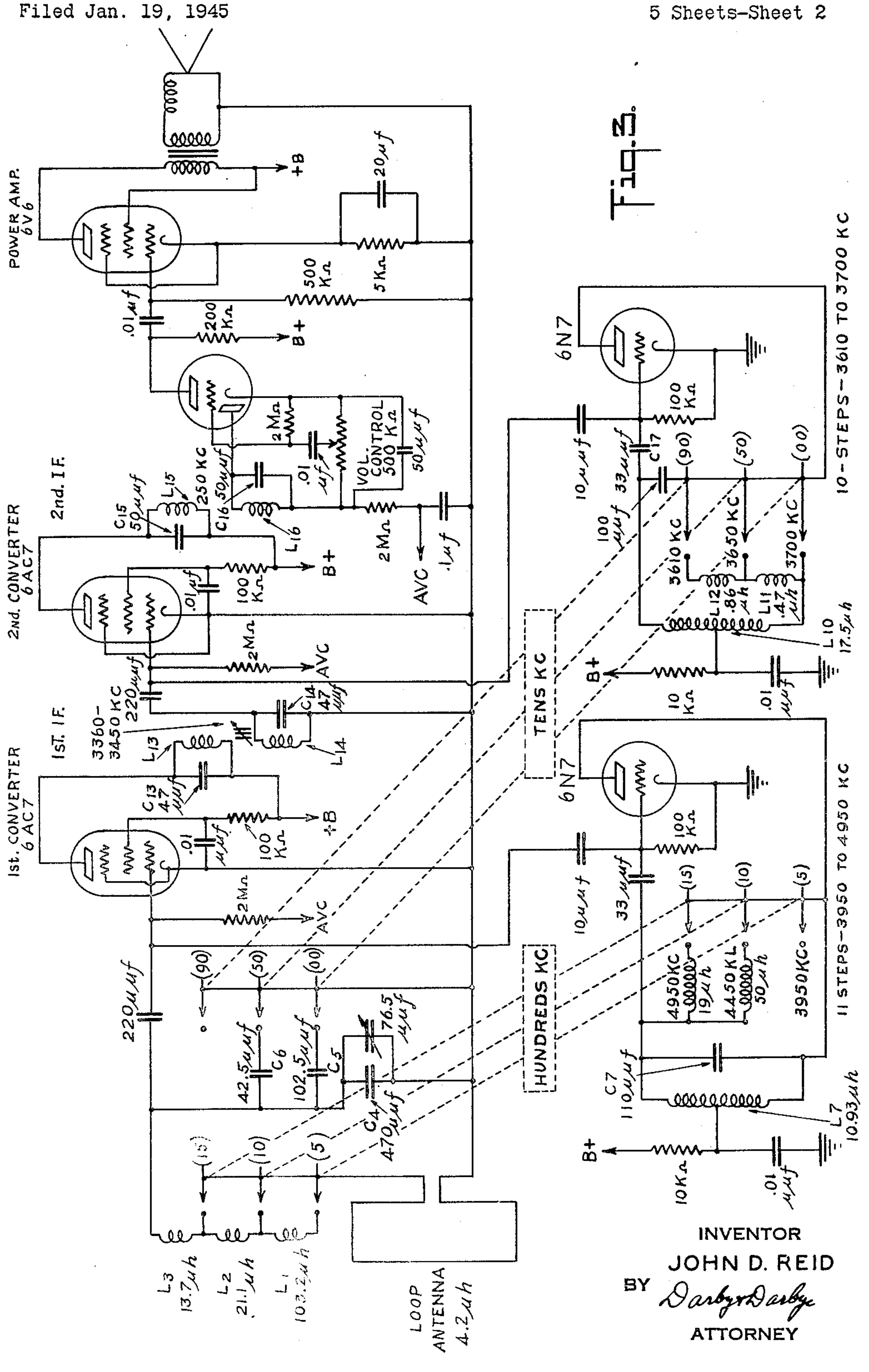
Figure 4:
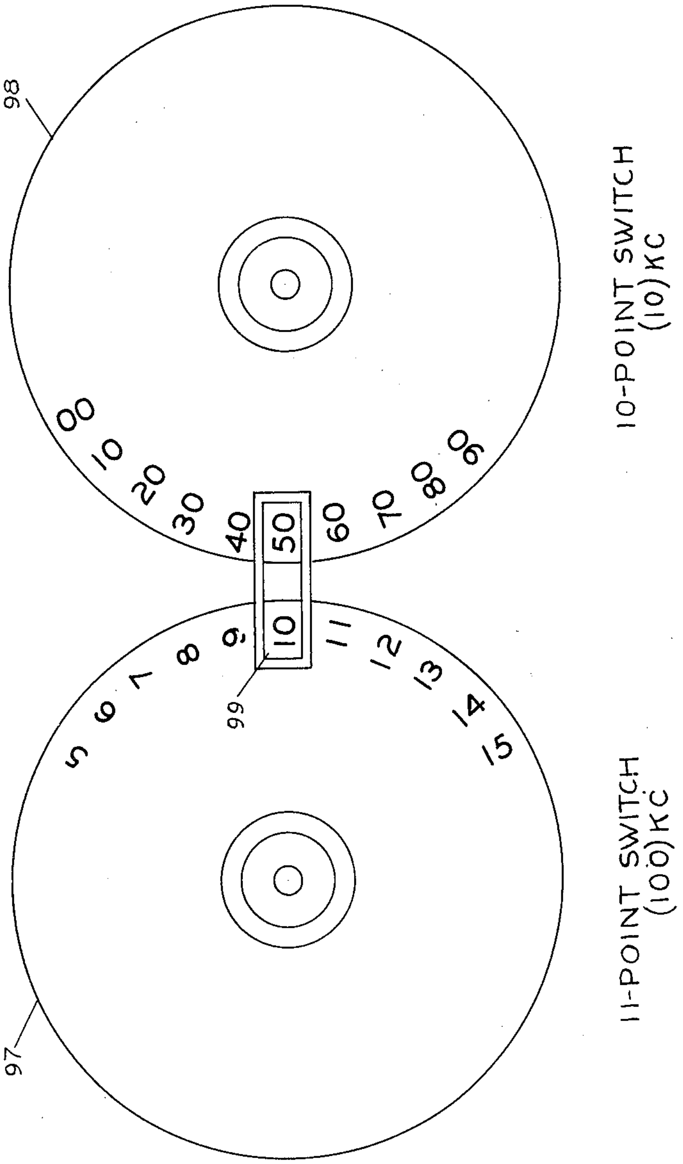
Figure 5:
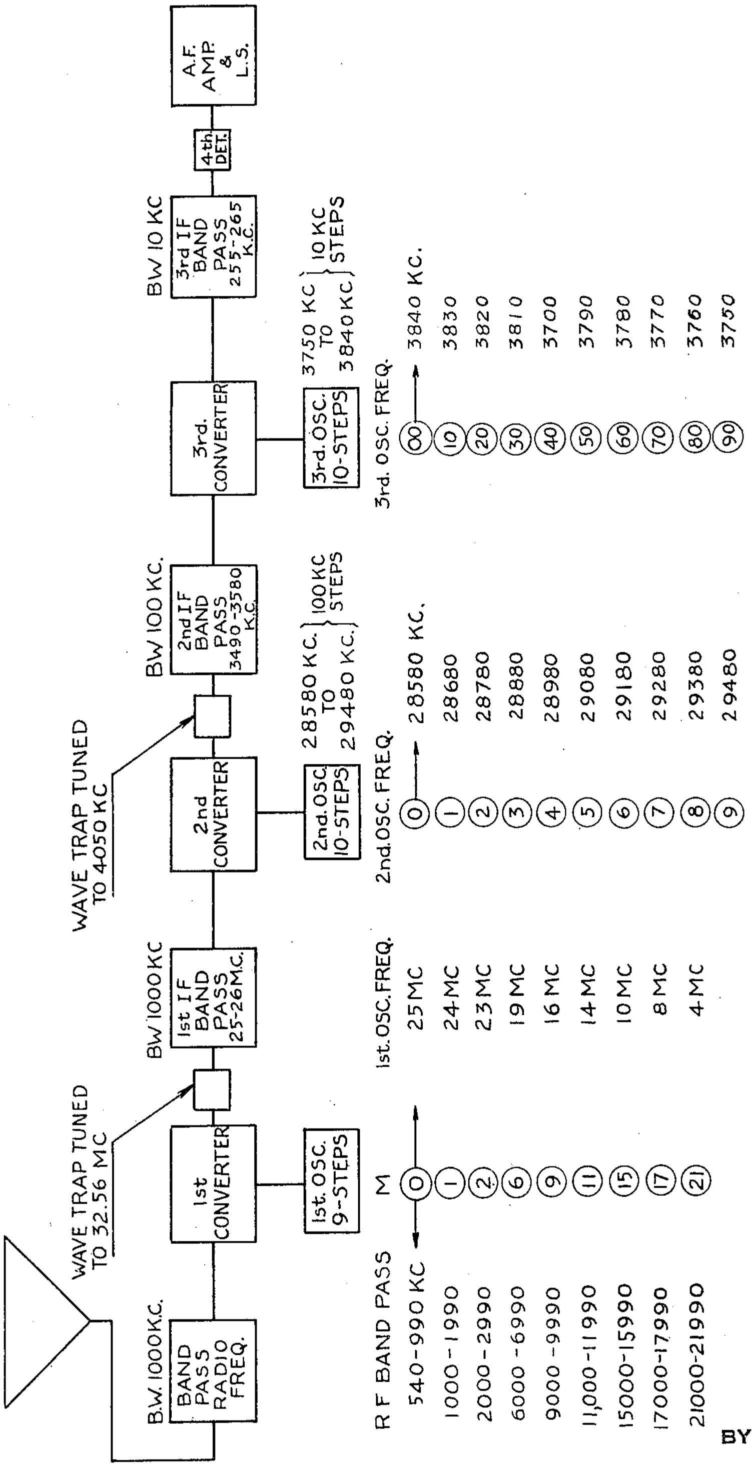
Figure 6:
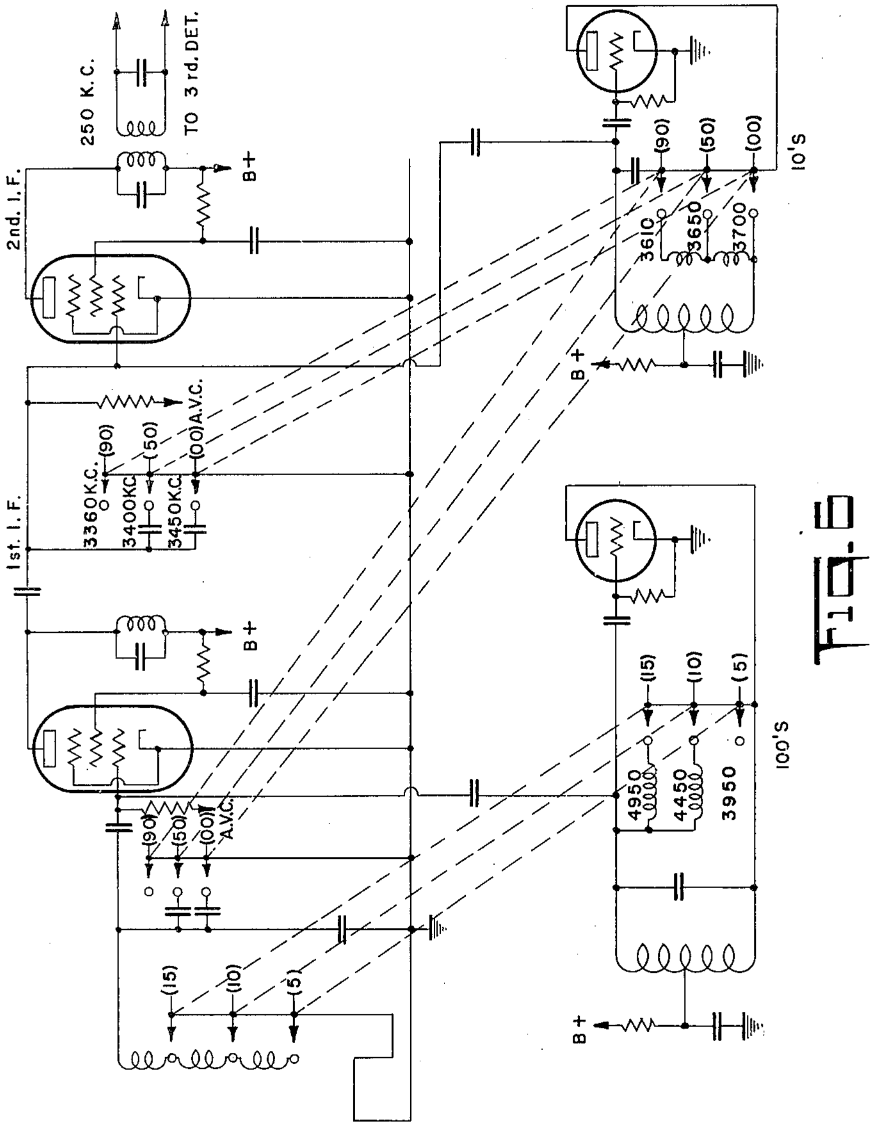

Figure 3 is a diagrammatic showing of a receiver circuit employing a plurality of coils selectable to tune the second oscillator circuit and in which the input circuit of the receiver is tuned to pass a band only 10 kilocycles wide by uni-control of the first oscillator coils with a plurality of tuning coils in the input circuit and uni-control of the second oscillator coils with a plurality of tuning condensers in the input circuit and in which preferred values for the elements are shown:

Figure 4 is a sketch illustrating a dial arrangement which may be used in lieu of push-buttons when tuning my receiver;

Figure 5 is a diagrammatic showing in block form of a receiver circuit of the triple conversion superheterodyne type which may be tuned by push-buttons throughout its range;

Figure 6 is a diagrammatic showing of a receiver circuit illustrating a modification in which an antenna circuit is tuned as to 100's of kilocycles by push buttons which also tune a first oscillator in 100's of kilocycles and the antenna circuit and the first intermediate frequency circuit are both tuned in 10's of kilocycles by push buttons which simultaneously tune a second oscillator in 10's of kilocycles.

Figure 7:
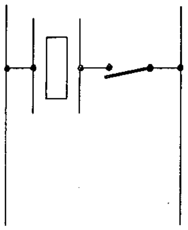
Figure 8:
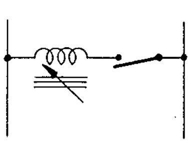

Figure 7 illustrates the use of piezo electric crystals to control the oscillator frequency; and Figure 8 illustrates the use of permeability tuning.

Figures 1, 2:
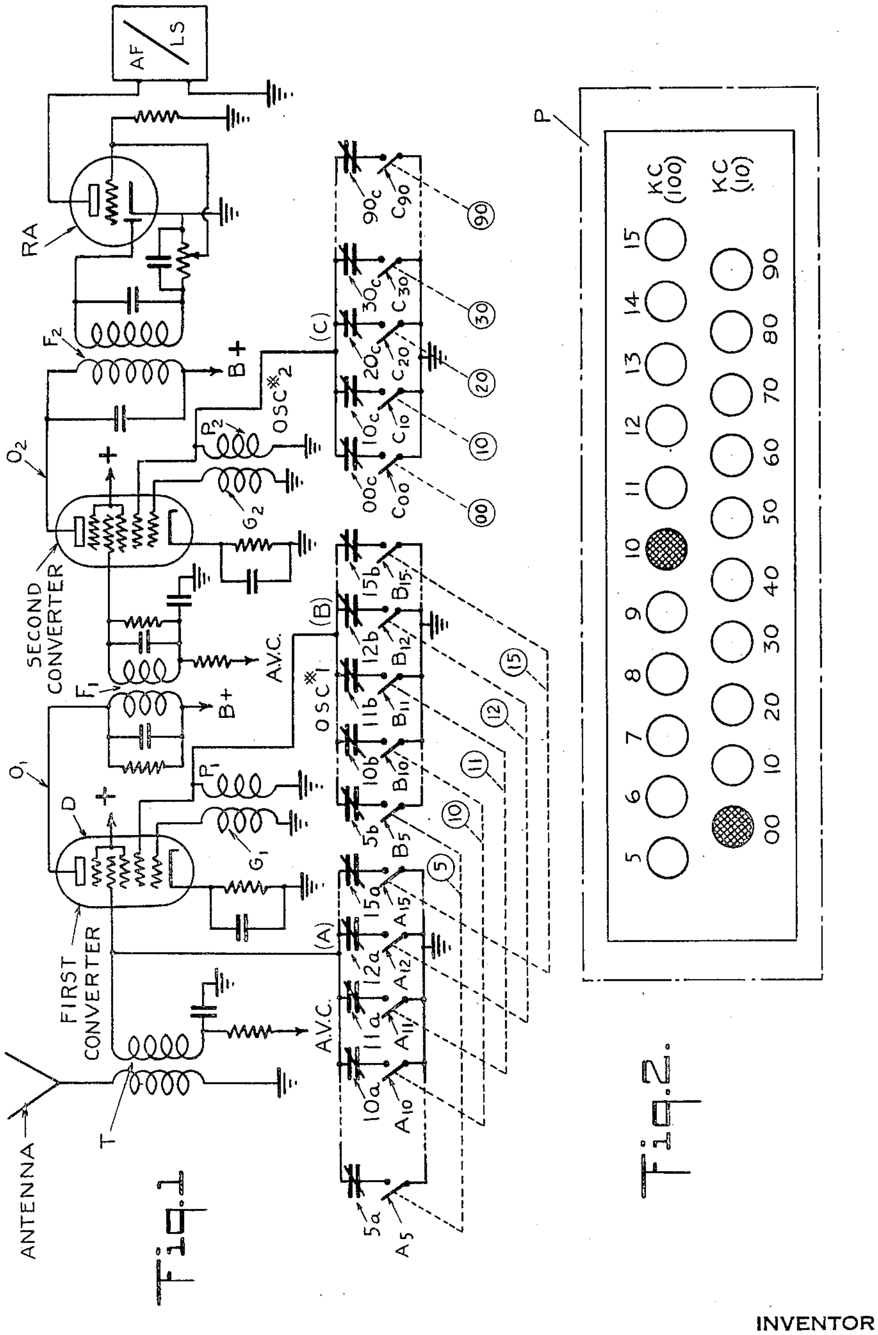
Figure 1 is a diagrammatic showing of the receiver circuit.
Figure 2 is a view showing the push-button arrangement in the front panel of the receiver.

Referring now particularly to Fig. 1 the circuit for illustrative purposes is shown to be of the double-heterodyne or double-conversion type. Radio signals picked up by the antenna are transferred through the radio frequency transformer T to the signal input grid of the first converter tube D which may be of the pentagrid or other suitable type. If amplification is desired before conversion a suitable amplifier may be interposed between transformer T and the converter D. Connected across the secondary of the input transformer T is a bank (A) of semi-fixed condensers numbered *5a* to *15a*, each of which has one of its terminals connected to the high potential end of the transformer secondary and to the signal grid of the converter D, the other terminals of said condensers being connected each by way of a separately actuated switch, shown at $A_5$, $A_{10}$, $A_{11}$, etc., to ground or the low potential end of the transformer secondary. The values of the several condensers of this bank are so chosen that each thereof in conjunction with the transformer secondary will constitute a tuned circuit which will pass a band of frequencies occupying a range of approximately 100 kilocycles at different portions of the received frequency band spectrum. Hereinafter this frequency range as well as others utilized in other parts of the receiver will be referred to as 100 kilocycles wide. It should be understood, however, that this range is approximate and may be more or less than 100 kilocycles.

The first and second grids of the first converter D are coupled in the conventional manner by the grid coil $G_1$ and the feed-back coil $P_1$ to constitute the first oscillator. In shunt to the feed-back coil there is connected a second bank (B) of semi-fixed condensers numbered *5b* to *15b*, each of which has one of its terminals connected to the high potential end of the coil $P_1$, the other terminals of said condensers being connected each by way of a separately actuated switch, shown at $B_5$, $B_{10}$, $B_{11}$, etc., to ground or the low potential end of the feed-back coil. The values of the several condensers of bank (B) are so chosen that the oscillator will produce a series of frequencies, with 100 kilocycles separation between adjacent oscillator frequencies.

The corresponding switches of the banks A and B, as for example, $A_5$—$B_5$, $A_{10}$—$B_{10}$, etc., are adapted to be uni-controlled as indicated by the dotted lines connecting them. The uni-controlled connections are identified by the numbers 5 to 15 enclosed in circles, the circle signifying in each case that the corresponding pair of uni-controlled switches is adapted to be controlled by a push-button and the number representing the channel frequency in "hundreds" of kilocycles that the receiver will be tuned to upon operation of a particular push-button.

one of the condensers *5a* to *15a* will tune the input to the first converter to allow in each case a pass band of 100 kilocycles to be transmitted. For example, operation of the switch $A_5$ connects the condenser *5a* into circuit and the carrier-fre- As shown in the table below, the selective operation of the switches in bank A to connect quencies from 500 to 590 kilocycles will be passed to the input grid of the first converter. Since the modulation frequencies of the first carrier-frequency of 500 kilocycles included in the band for switch $A_5$ extend on either side of said carrier, between 495 and 505 kilocycles, and the modulation frequencies of the last carrier-frequency of 590 kilocycles of this band extend on either side of said carrier, between 585 and 595 kilocycles, the entire band of frequencies that will be passed by the input circuit to the first converter will be from 495 to 595 kilocycles or a band of frequencies 100 kilocycles wide. Operation of the switch $A_{10}$ connects the condenser *10a* into circuit and the carrier-frequencies from 1000 to 1090 kilocycles or a frequency band 100 kilocycles wide will be passed to the first converter, etc. Similarly, the selective operation of the switches $B_5$ to $B_{15}$ in the bank B will tune oscillator #1 of the first converter in steps of 100 kilocycles from 3500 kilocycles for switch $B_5$ to 4500 kilocycles for switch $B_{15}$.

| (A) | | (B) | | $O_1$ | (C) | | $O_2$ |
|---|---|---|---|---|---|---|---|
| | *Kilocyles* | | *Kilocycles* | *Kilocycles* | | *Kilocycles* | *Kilocycles* |
| $A_5$ | 500–590 | $B_5$ | 3,500 | | $C_{00}$ | 2,545 | 365–455 |
| $A_6$ | 600–690 | $B_6$ | 3,600 | | $C_{10}$ | 2,535 | 375–465 |
| $A_7$ | 700–790 | $B_7$ | 3,700 | | $C_{20}$ | 2,525 | 385–475 |
| $A_8$ | 800–890 | $B_8$ | 3,800 | | $C_{30}$ | 2,515 | 395–485 |
| $A_9$ | 900–990 | $B_9$ | 3,900 | | $C_{40}$ | 2,505 | 405–495 |
| $A_{10}$ | 1,000–1,090 | $B_{10}$ | 4,000 | 2,910–3,000 | $C_{50}$ | 2,495 | 415–505 |
| $A_{11}$ | 1,100–1,190 | $B_{11}$ | 4,100 | | $C_{60}$ | 2,485 | 425–515 |
| $A_{12}$ | 1,200–1,290 | $B_{12}$ | 4,200 | | $C_{70}$ | 2,475 | 435–525 |
| $A_{13}$ | 1,300–1,390 | $B_{13}$ | 4,300 | | $C_{80}$ | 2,465 | 445–535 |
| $A_{14}$ | 1,400–1,490 | $B_{14}$ | 4,400 | | $C_{90}$ | 2,455 | 455–545 |
| $A_{15}$ | 1,500–1,590 | $B_{15}$ | 4,500 | | | | |

As mentioned above corresponding switches for banks A and B are controlled in unison so that in each case the resulting intermediate frequency, the range between 2910 and 3000 kilocycles, will appear in the output circuit $O_1$ of the converter D.

It is to be noted that only the tuned circuit or circuits ahead of the first converter determine what band of frequencies reaches the converter and this band is 100 kilocycles wide. The particular 100 kilocycle band of frequencies reaching the first converter will be determined by which push-button is depressed to tune the radio frequency circuits, and the signal frequency it is desired to receive will be included in the band so selected. The first converter simply increases the frequency of all signals reaching its grid by an amount determined by the oscillator frequency which is in turn determined by the push-button depressed. By design, the band of frequencies passed from the first converter to the second converter is 100 kilocycles wide and is the same band of frequencies for all push-buttons.

The band-pass filter $F_1$ in the output of the first converter is of known construction and is effective to pass the entire band of intermediate frequencies from 2910 to 3000 kilocycles to the signal control grid of the second converter H which may also be of the pentagrid type.

The first and second grids of this converter, as in the first converter, are coupled by way of coils $G_2$ and $P_2$ to constitute oscillator #2. Connected in shunt across the oscillator feed-back coil $P_2$ is a third bank C of condensers numbered 00c, 10c, 20c to 90c each of which has one of its terminals connected to the high potential end of the coil $P_2$, the other terminals of said condensers being connected each by way of a separately actuated switch, shown at $C_{00}$, $C_{10}$, $C_{20}$, etc., to ground or the low potential end of the feed-back coil. The values of the several condensers of this bank are so chosen that the second oscillator is adapted to operate at the frequencies indicated in the above table, from 2545 kilocycles for condenser 00c to 2455 kilocycles for condenser 90c, there being a 10 kilocycle separation between adjacent oscillator frequencies.

The beat frequencies resulting from the interaction between any one of the frequencies generated by oscillator #2 and the first intermediate band of frequencies 2910 to 3000 kilocycles will appear in the output $O_2$ of the second converter, the values being indicated in the above table in the column under $O_2$, it being noted that the beat frequencies in each case occupy a band 100 kilocycles wide. Connected between the output of the second converter and the demodulator diode of the diode-triode tube RA is a second I. F. transformer $F_2$ tuned to an intermediate frequency of 455 kilocycles, the value commonly chosen as the intermediate frequency in receivers of the superheterodyne type although as explained later it is very desirable to use a lower frequency second I. F. As a consequence only a frequency of that value will be transmitted to the demodulator and audio amplifier tube RA, it being noted that the 455 kilocycle intermediate frequency is common to the several intermediate frequency ranges. If desired the audio frequency may be further amplified and then reproduced in the usual way through a loudspeaker, the block AF/LS representing the latter elements.

In Fig. 2 there is shown the front panel P of the receiver and a possible arrangement of the push-buttons, the push-buttons 5 to 15 in one row being adapted to control the switches $A_5$ to $A_{15}$ and $B_5$ to $B_{15}$ in banks A and B, respectively, and the push-buttons indicated 00 to 90 in another row being adapted to control respectively the switches $C_{00}$ to $C_{90}$ in bank C.

Assuming now that it is desired to tune in a station operating at the channel frequency of 1000 kilocycles, the button 10 in the top row representing the number of "hundred" kilocycles and the button 00 in the lower row representing the number of kilocycles in "tens" would be depressed. As a result the condenser 10 associated with the switch $A_{10}$ in bank A will be connected across the input transformer secondary to tune the same so that it will accept a frequency band between 1000 and 1090 kilocycles. Simultaneously therewith the condenser 10b associated with the switch $B_{10}$ in bank B will cooperate with the feed-back coil of oscillator #1 to produce a frequency of 4,000 kilocycles. The intermediate frequency resulting therefrom, as will be the case for any of the buttons 5 to 15, will be the range of frequencies between 2910 and 3000 kilocycles. The condenser 00c connected across the feed-back coil of oscillator #2, as a result of the operation of button 00, will cause the oscillator portion of the second converter to operate at a frequency of 2545 kilocycles. The mixing of this frequency with the band of frequencies passed by the band-pass filter $F_1$ will result in the frequency range from 365 to 455 kilocycles being present in the output of the second converter. However, since the second I. F. network $F_2$ is tuned to pass only a frequency of 455 kilocycles, the selected value for the intermediate frequency of the receiver, the other frequencies in the band will be attenuated, so that only the carrier-frequency of the desired station, namely, 1000 kilocycles, will be demodulated and then amplified in the remaining portion of the receiver. Similarly, any combination of push-buttons in the first and second rows will produce the desired signal frequency in the output of the receiver. It will be understood of course that only one push-button in each row may be operated at any one time, the usual arrangement in push-button receivers being employed to effect a release of a previously operated push-button upon actuation of a different push-button.

While the above described embodiment of the invention involves the selective switching in of condensers in each of the banks A, B and C, it will be understood of course that the same result is obtainable by the selective switching in of coils, which may be permeability tuned, or of a coil and condenser combination.

In Figure 3 I have illustrated another double conversion superheterodyne type of circuit using the same number of push-buttons for the same number of stations as the circuit of Figure 1 but which has several desirable features in addition to those shown in Figure 1. In this circuit I have also designated preferred values for the various elements shown.

In Figure 3 a loop antenna is shown having a plurality of coils $L_1$, $L_2$, $L_3$, etc., (which may be connected in multiple) in series therewith in the input circuit to the first converter. There will be eleven such coils for the standard broadcast band, each of which may be selected by one of the "hundreds" kilocycles push-buttons illustrated in Figure 2. These coils may be formed by one coil with ten taps thereon. These coils will be uni-controlled with eleven coils which determine the frequency of the first oscillator which in this case is illustrated as a separate tube from the first detector or converter tube. Three such oscillator coils are illustrated and their values indicated, the value of the coil corresponding to a 500 kilocycles incoming signal being the oscillator coil $L_7$ itself without any shunt coil added. These coils cause the oscillator to produce any frequency from 3950 kilocycles to 4950 kilocycles in steps of 100 kilocycles. The input circuit to the first converter is tuned to the particular carrier with a 10 kilocycle side band by means of the condensers $C_5$, $C_6$, etc., selectively connectable across the input circuit by the "tens" push-buttons. There will be 9 such condensers which are uni-controlled with the 10 kilocycles push-buttons, no condenser being used for the highest frequency or "90" button. The "10" kilocycle buttons, Fig. 2, also select the oscillator series coils for the second oscillator, there being one main coil and nine series coils.

In case it is desired to select an incoming carrier of 1000 kilocycles the "10" push-up button in the "hundreds" row, Fig. 2, will be pushed and this will operate the switch marked (10) in the antenna circuit, Fig. 3, and the switch marked (10) in the first oscillator circuit, Fig. 3. The "00" push button, Fig. 2, in the 10 kilocycles row will be pushed and this will operate the switch marked (00), Fig. 3, to connect condenser $C_5$ in the antenna circuit and the switch marked (00) in the second oscillator circuit, Fig. 3. The first oscillator will accordingly produce a frequency of 4,450 kilocycles which will beat with the desired carrier of 1000 kilocycles to produce in the output of the first converter a frequency of 3450 kilocycles. It will also beat with incoming signal frequencies in the thousand kilocycle frequency range, that is, frequencies from 1000 kilocycles to 1090 kilocycles to produce in the output of the first converter a range of frequencies from 3360 kilocycles to 3450 kilocycles, but due to the sharp tuning of the input circuit the intermediate frequency of 3450 kilocycles will predominate in the output of the first converter.

Similarly, if any of the other "hundreds" buttons are pushed, the selected first oscillator frequency will beat with incoming signal frequencies in the corresponding hundreds of kilocycles to produce the same range of from 3360 kilocycles to 3450 kilocycles in the output of the first converter. The first intermediate frequency circuit between the first and second converters will have a band pass characteristic which will pass a band of frequencies from 3360 kilocycles to 3450 kilocycles, to the second converter.

The second oscillator will have one main coil $L_{10}$ and 9 series coils $L_{11}$, $L_{12}$, etc., which may be selected by push-buttons in the "tens" row, Fig. 2, so that the oscillator produces in steps of 10 kilocycles any frequency from 3610 kilocycles to 3700 kilocycles. In the second converter the selected oscillator frequency will beat with the first intermediate frequency to produce in the output of the second converter a range of frequencies 100 kilocycles wide ranging from 160 kilocycles to 250 kilocycles in the case of the "90" button, when the second oscillator will produce a frequency of 3610 kilocycles, and from 250 to 340 kilocycles in the case of the "00" button, when the second oscillator will produce a frequency of 3700 kilocycles. Each band of 100 kilocycles produced in the output of the second converter will include a band of 10 kilocycles centered at 250 kilocycles. The second intermediate frequency circuit will be tuned to pass a band of 10 kilocycles centered at 250 kilocycles and this selected carrier will always be the one to which the antenna circuit was tuned. The second intermediate frequency signal may be detected, amplified and translated in the remainder of the circuit according to the usual practice.

Inasmuch as the antenna circuit is tuned to a particular carrier to be received the antenna circuit will have a high gain for this particular carrier, and even though the first intermediate frequencies circuit does not select this carrier to the exclusion of others in the same or adjacent "hundreds" range it will nevertheless be highly amplified at this stage and spurious responses such as "image frequency response" or responses from harmonics of the oscillator will be attenuated. The second converter will also have a high gain for the particular desired signal and will provide the adjacent channel selectively.

If greater selectivity and first I. F. stage gain is desired, the first I. F. stage in Fig. 3 may be made only 10 kilocycles wide and tuned in steps of 10 kilocycles from 3450 to 3360 kilocycles. Thus tuning would cause no complication in operation of the receiver as the switches to perform it would be ganged with the second oscillator 10 kilocycles step switches. The second oscillator "00" button would then tune the first I. F. stage to 3450 kilocycles and the "90" button would tune the first I. F. stage to 3360 kilocycles. The actual tuning of the first I. F. stage in steps of 10 kilocycles would be done by switching the inductance or capacity of the tuned circuits L13 C13 and L14 C14, Fig. 3. Such an arrangement is shown in Fig. 6. Another alternative would be to use impedance coupling instead of a transformer for the first I. F. stage in which case only one circuit would need to be switched. This would afford even higher I. F. gain.

I prefer to use separate oscillators rather than pentagrid converters because at the present state of the art the tubes commercially available are better adapted to this type of circuit when selected for use in such a manner. For example, I have illustrated the use of 6AC7 tubes for the two converters. This type of tube has a conversion conductance of approximately 3200 micromhos. By the use of this tube it is possible to obtain from three to six times the gain at each converter over what could be obtained with present combined oscillator detector tubes. The two oscillator tube sections would, of course, be in a single envelope if a 6N7 tube were used, as illustrated.

In Figure 4 I have illustrated a type of tuning dial which may be used with my circuit in lieu of push-buttons, if desired. I have shown one switch which may be rotated to select one of a plurality of contacts corresponding to the "hundreds" push-buttons, and another dial switch which may be rotated to select a contact corresponding to the "tens" push-buttons. A window 99 is illustrated displaying an indication of the selected station. If it is desired to tune in a station having a frequency of 1050 kilocycles for example, the "hundreds" dial 97 is rotated until the figure 10 appears in the window. This will make the same selection as was made by pushing the "10" button in the hundreds row, Fig. 2. The "10" dial 98 will be similarly rotated until the figure 50 appears in the window 99. This will make the same selection as if the "50" button were pushed in the "tens" row, Fig. 2. The frequency the receiver is tuned to may thus be read directly from the figures appearing in the window 99.

The double superheterodyne circuit of Figs. 1 or 3 may be extended to cover short wave bands if desired. There are at present seven internationally assigned bands for short wave broadcasting. These are as follows:

| | Kilocycles |
|---|---|
| 49 meter band | 6,000 to 6,200 |
| 30 meter band | 9,500 to 9,700 |
| 25 meter band | 11,700 to 11,900 |
| 19 meter band | 15,100 to 15,350 |
| 16 meter band | 17,750 to 17,850 |
| 13 meter band | 21,450 to 21,750 |
| 11 meter band | 25,575 to 25,850 |

The latter three bands are very little used as these frequencies are only satisfactory for transmission of daylight paths. By the addition of nine 100's buttons to the push-button-tuned double superheterodyne, the first four shortwave bands can be covered. These nine new 100's buttons would be marked as follows, and the corresponding first oscillator and antenna frequencies (kilocycles) are indicated.

| 100's Buttons Marking | 1st Oscillator Frequencies | Antenna Center Frequencies |
|---|---|---|
| 60 | 9,450 | 6,050 |
| 61 | 9,550 | 6,150 |
| 95 | 12,950 | 9,550 |
| 96 | 13,050 | 9,650 |
| 117 | 15,150 | 11,750 |
| 118 | 15,250 | 11,850 |
| 151 | 18,550 | 15,150 |
| 152 | 18,650 | 15,250 |
| 153 | 18,750 | 15,350 |

With crystal control of the oscillators push-button tuning of shortwave stations is highly desirable as it permits the selection of the desired shortwave station without waiting for station announcement.

In Figure 5 I have illustrated, largely in block form, a triple conversion superheterodyne circuit which may be used with a minimum of push-buttons or other switching devices to cover other bands such as shortwave bands in addition to the standard broadcast band, and to allow the selection of any 10 kilocycles channel in each band. In this case, there would be a third row of buttons which I have illustrated under the letter M. The input circuit to the receiver would be tuned as before but this time in steps of one megacycle so that it would pass to the first converter frequencies within a band 1 megacycle wide. The same push-button in row M (the "thousands" row) which controlled the tuning of the input circuit would also control the tuning of the first oscillator. For frequencies in the broadcast band between 540 and 1000 kilocycles the zero push-button in M row would be used and the input of the receiver would be limited to 540 to 1000 kilocycles. This would be done by interlocking means preventing the depression of 100's buttons less than "5" when the 1000's "0" button is depressed. I have illustrated nine "thousands" push-buttons under the letter M, with the corresponding first oscillator frequencies indicated.

The first oscillator frequency for the "0" button would be 25 megacycles and since this is a frequency passed by the first I. F. stage, auxiliary-switch contacts would be provided on the "0" button to limit the I. F. bandpass so as not to include 25 megacycles. The required I. F. band to be passed would be 25,540 kilocycles to 26,000 kilocycles. The simplest thing, however, would be just to shift the pass band of the first I. F. stage when the thousands "0" button is depressed so that it covered a band of 25,500 to 26,500 kilocycles. This would be done by switching means which removed a portion of the shunt-capacities tuning the first I. F. transformer; or by switching-means which changed or removed a portion of the inductances used in the first I. F. transformer. The first intermediate frequency circuit would be a band pass circuit passing a band from 25 to 26 megacycles. The second oscillator circuit would be tunable in ten steps of 100 kilocycles each from 28,580 to 29,480 kilocycles and would of course be controlled by ten push-buttons corresponding to the "hundreds" row in Fig. 2. The second intermediate frequency stage would pass a band extending from 3,490 kilocycles to 3,580 kilocycles. The third oscillator would in turn be controlled by ten push buttons in steps of 10 kilocycles each to produce a frequency of 3,750 kilocycles to 3,840 kilocycles. The third intermediate frequency stage would be tuned to pass a band 10 kilocycles wide from 255 kilocycles to 265 kilocycles. Following the third intermediate frequency circuit the signal could be detected, amplified and translated in accordance with usual practice.

The input circuit of a triple superheterodyne receiver as illustrated in Fig. 5 may be tuned to a 10 kilocycle channel similarly to the circuit of Fig. 3. In the case of Fig. 5, the 1,000's decade of switches under the letter M may, in addition to controlling the first oscillator frequency, tune the input to frequencies one megacycle wide as indicated in the column labeled R. F. bandpass. The 100's decade of switches, in addition to controlling the frequency of the second oscillator, may also add or subtract capacity or inductance to the coils of the input circuits selected by 1,000's decade switches so as to tune the input in steps of 100 kilocycles. Then in turn, the 10's decade buttons, in addition to controlling the frequency of the third oscillator, may switch small increments of capacity or inductance in the tuned input circuit so as to tune the input circuit to the 10 kilocycles channel desired.

The selection of the frequencies to be used in double conversion and triple conversion superheterodyne circuits involves certain considerations which should be kept in mind.

In the first place if all amplifier tube output circuits are tuned to different frequencies from the input circuits very high gain may be attained. A high intermediate frequency for all but the last gives a good image ratio, while a low last intermediate frequency, enables excellent adjacent channel selectivity to be obtained in two tuned circuits.

In the second place when a continuous tuning range of a frequency ratio of two to one or more is required the first intermediate frequency should be at least double the highest desired incoming signal frequency. This is not necessary in the case of the triple conversion circuit shown in Fig. 5 because, in this case, certain bands have been skipped, i. e., a continuous tuning range is not provided. It will be noted that no incoming signal is to be selected at 12 megacycles which would be one-half the first intermediate frequency or at 8 megacycles which would be one-third the first intermediate frequency, so there would be no trouble with second and third order effects. In the triple conversion circuit of Fig. 5 the second intermediate frequency should be placed in one of the gaps where no signals are to be received and preferably chosen so harmonics of the third oscillator would not interfere with the first intermediate frequency or with the second oscillator frequency or generate the third intermediate frequency in conjunction with the first or second oscillator frequency. No harmonics of the second or third oscillator, furthermore, should be at a frequency generated by the first oscillator.

In the third place the last intermediate frequency should be at or below one-half of the lowest desired incoming signal frequency. This will ensure that the spurious signal developed by the heterodyning of the first oscillator with the last oscillator will be higher than the last intermediate frequency, thus obviating interference effects.

Although the double conversion superheterodyne circuit has been well known for many years it has not heretofore been used in sets made for public sale because the foregoing conditions had not been recognized, with the result that such receivers have had so many spurious responses that satisfactory performance was impossible.

It should be noted that my circuits are admirably designed to permit the use of piezo electric crystals for control of the oscillator tuning, as illustrated in Fig. 7. In the circuit of Figs. 1 and 3, for example, if the tuning of each oscillator is crystal controlled only 21 crystals would be required for automatic selection of any of the 106 channels in the standard broadcast band, while eight additional crystals, or a total of twenty-nine, in the circuit of Fig. 5, would permit the automatic selection of any of the 851 channels indicated.

It will be understood, of course, that the number of channels available for selection equals the number of 10's decade switches multiplied by the number of 100's decade switches, and, in the case of the triple superheterodyne circuit of Fig. 5, again multiplied by the number of 1,000's decade switches, except where some stations are deliberately omitted as those below 540 kilocycles in Fig. 5.

By the use of a first intermediate frequency which is high with respect to the signal, the image response from the second oscillator is attenuated by the input circuit to the set. If desired, however, a wave trap may be used in the output of the first converter which is tuned to a frequency equal to the first intermediate frequency plus twice the second intermediate frequency, or, in the case of Fig. 5, a frequency of 32.56 megacycles, which corresponds to the image. Similarly, a wave trap may be added in the output of the second converted which is tuned to a frequency equal to the second intermediate frequency plus twice the third intermediate frequency, or in the case of Fig. 5 a frequency of 4050 kilocycles.

Inductive tuning of the antenna circuit is preferable, particularly where a low impedance loop is used as illustrated in Fig. 3, because it enables a relatively large fixed capacity $C_4$ to be used. This allows the impedance of the input to the grid of the first tube to be reduced, thus improving the signal-to-noise ratio.

Although I have illustrated preferred embodiments of my invention as employing push-buttons, it will be understood that any arrangement for obtaining the required variations in steps or equivalent could be used. Ganged permeability tuning means, as shown for example in Fig. 8, could be employed.

In the above description, where the term semifixed is used in referring to condensers or coils, it is understood that there is meant a coil or condenser which may be adjusted slightly to an accurately determined value, but which does not need to have a wide range of adjustment. Also, where particular frequencies are mentioned, it is to be understood that the frequencies indicated are those of the carrier which will normally have associated therewith modulation side bands.

Although there have been shown and described certain preferred embodiments of the invention it will be understood that modifications and changes may be made without departing from the spirit of the invention. I do not desire, therefore, to be restricted to the particular details shown and described, but only within the scope of the appended claims.

What is claimed is:

1. The method of operating a radio receiver to select any 10 kilocycle modulated carrier channel within a given band of signal modulated radio carrier frequencies, which consists in receiving a narrow band of said frequencies which contains a plurality of 10 kilocycle channels including the desired channel, mixing said band of frequencies with a locally produced frequency to produce a narrow band of intermediate frequencies, which latter band is the same for any selected 10 kilocycle channel in the given band of frequencies, mixing said band of intermediate frequencies with a second locally produced frequency, which frequency is different for any selected 10 kilocycles channel in the given band of frequencies, to produce a second narrow band of intermediate frequencies, which second band is in width a multiple of 10 kilocycles and the same for certain groups of 10 kilocycle channels and different for certain other 10 kilocycle channel groups, and selecting from said second band of frequencies a single frequency which contains the signal modulations of the desired 10 kilocycle channel.

2. The method of operating a radio receiver to select any 10 kilocycle modulated carrier channel within a given band of signal modulated radio carrier frequencies, such as the broadcast band, by means of several banks of push-buttons, one bank representing the number of "hundred" kilocycles and another bank representing the number of kilocycles in "tens," which consists in the selective operation of one of the push-buttons of the "hundred" kilocycles bank and the selective operation of one of the push-buttons in the "tens" bank, said first selective operation resulting in the reception of a narrow band of frequencies which contains a plurality of 10 kilocycle channels including the desired channel and in the mixing of said band of frequencies with a locally produced frequency to produce a narrow band of intermediate frequencies, which latter band is the same for any selected 10 kilocycle channel in the given band of frequencies, the second selective operation resulting in the mixing of said band of intermediate frequencies with a second locally produced frequency to produce a second narrow band of intermediate frequencies, which second band is the same for certain groups of 10 kilocycle channels and different for certain other 10 kilocycle channel groups, and selecting from said second band of frequencies a single frequency which contains the signal modulations of the desired 10 kilocycle channel.

3. A radio receiver comprising a first frequency converter, a first set of reactors selectively operated to impress upon the input of said converter a narrow range of modulated radio carrier frequencies, a second set of reactors selectively operated to tune the oscillator portion of the first converter to a frequency such that the latter will mix with said frequency range applied to the converter input to produce a narrow range of intermediate frequencies, a second frequency converter, means for impressing said range of intermediate frequencies onto the input of the second converter, a third set of reactors selectively operated to tune the oscillator portion of the second converter to a frequency which will mix with the range of intermediate frequencies to produce a band of frequencies of substantially constant width, adjacent ones of such bands being in overlapping relation, and the several bands containing a common frequency, means for selecting said common frequency, and means for demodulating, amplifying and reproducing said common frequency.

4. A receiver according to the invention defined in claim 3 wherein the several sets of reactors are constituted by condensers.

5. A receiver according to the invention defined in claim 3 wherein the several sets of reactors are constituted by coils.

6. A receiver according to the invention defined in claim 3 wherein the several sets of reactors are constituted by coil and condenser combinations.

7. A radio receiver comprising first and second frequency converters, a first set of selectively operated reactors each of which is adapted to tune the input of the first converter to accept a different frequency range, a second set of selectively operated reactors each of which is adapted to tune the oscillator portion of the first converter to a frequency such that the latter will mix with each different frequency range applied to the converter input to produce the same range of intermediate frequencies, means for impressing said range of intermediate frequencies onto the input of the second converter, a third set of selectively operated reactors each of which is adapted to tune the oscillator portion of the second converter to a frequency which will mix with the range of intermediate frequencies to produce a band of frequencies of substantially constant width, adjacent ones of such bands being in overlapping relation and the several bands containing a common frequency, means for selecting said common frequency, and means for demodulating, amplifying and reproducing said common frequency.

8. A radio receiver as defined in claim 7 wherein the several sets of reactors are constituted by condensers and wherein a push-button controls the operation of corresponding condensers of the first and second sets, and another push-button controls the operation of each condenser in the third set.

9. A radio receiver as defined in claim 7 wherein the several sets of reactors are constituted by permeability-tuned coils and wherein a push-button controls the operation of corresponding coils of the first and second sets, and another push-button controls the operation of each coil in the third set.

10. A radio receiver comprising first and second frequency converters, a first set of semi-fixed condensers which are adapted to be selectively switched to tune the input of the first converter to accept different frequency ranges, a second set of semi-fixed condensers which are adapted to be selectively switched to tune the oscillator portion of the first converter to a frequency such that the latter will mix with each different frequency range applied to the converter input to produce the same range of intermediate frequencies, means for impressing said range of intermediate frequencies onto the input of the second converter, a third set of semi-fixed condensers which are adapted to tune the oscillator portion of the second converter to a frequency which will mix with the range of intermediate frequencies to produce a band of frequencies of substantially constant width, adjacent ones of such bands being in overlapping relation and the several bands containing a common frequency, means for selecting said common frequency, and means for demodulating, amplifying and reproducing said common frequency.

11. A radio receiver operated solely by push-buttons comprising a first row of push-buttons representing "hundreds" of kilocycles and a second row of push-buttons representing "tens" of kilocycles, a first converter network under the control of the selective operation of any one of the push-buttons of the first row, and a second converter network under the control of the selective operation of any one of the push-buttons of the second row, said networks being so constructed and arranged that the frequency desired to be received is determined by the operation of one of the buttons in the first row and one of the buttons in the second row.

12. The method of operating a radio receiver to select any 10 kilocycle carrier modulated channel within a given band of signal modulated radio carrier frequencies, which consists in receiving a narrow band of such frequencies which contains a single desired 10 kilocycle channel, mixing said band of frequencies with a locally produced frequency to produce a narrow band of intermediate frequencies which latter band is the same for any selected 10 kilocycle channel in the given band of frequencies, mixing said band of intermediate frequencies with a second locally produced frequency which frequency is different for any selected 10 kilocycle channel in the given band of frequencies to produce a second narrow band of intermediate frequencies which second band is in width a multiple of 10 kilocycles and the same for certain groups of 10 kilocycle channels and different for certain other 10 kilocycle channel groups, and selecting from said second band of frequencies a single frequency which contains the signal modulations of the desired 10 kilocycle channel.

13. The method of operating a radio receiver to select any 10 kilocycle modulated carrier channel within a given band of signal modulated radio carrier frequencies, such as the broadcast band, by means of several banks of push-buttons, one bank representing the number of "hundred" kilocycles and another bank representing the number of kilocycles in "tens," which consists in the selective operation of one the push-buttons of the "hundred" kilocycles bank and the selective operation of one of the push-buttons in the "tens" bank, said first selective operation resulting in the reception of a narrow band of frequencies which contains a single desired 10 kilocycle channel, producing a wave locally, mixing said band of frequencies with said locally produced wave to produce a narrow band of intermediate frequencies, which latter band is the same for any selected 10 kilocycle channel in the given band of frequencies, producing a second wave locally, the second selective operation resulting in the mixing of said band of intermediate frequencies with said second locally produced wave to produce a second narrow band of intermediate frequencies, which second band is the same for certain groups of 10 kilocycle channels and different for certain other 10 kilocycle channel groups, and selecting from said second band of frequencies a single frequency which contains the signal modulations of the desired 10 kilocycle channel.

14. A radio receiver comprising first and second frequency converters, a first set of selectable reactances each of which is adapted to tune the input of the first converter to accept a different frequency range, a second set of selectable reactances each of which is adapted to tune the input of the first converter to accept a different band within a range selected by said first set, a third set of selectable reactances each of which is adapted to tune the oscillator portion of the first converter to a frequency such that the latter will mix with each different frequency range applied to the converter input to produce the same range of intermediate frequencies, means for impressing said range of intermediate frequencies onto the input of the second converter, a fourth set of selectable reactances each of which is adapted to tune the oscillator portion of the second converter to a frequency which will mix with the range of intermediate frequencies to produce a band of frequencies of substantially constant width, adjacent ones of such bands containing a common frequency, means for selecting said common frequency, and means for demodulating, amplifying and reproducing said common frequency.

15. A radio receiver as defined in claim 14, wherein the first, third and fourth sets of reactances are constituted by inductances and the second set of reactances is constituted by condensers.

16. A radio receiver as defined in claim 14, wherein a push-button controls the selection of corresponding reactances of the first and third sets and another push-button controls the selection of the corresponding reactances of the second and fourth sets.

17. A radio receiver as defined in claim 14, wherein a switch controls the selection of corresponding reactances of the first and third sets and another switch controls the selection of corresponding reactances of the second and fourth sets.

18. A radio receiver as defined in claim 7 in which a piezo electric crystal controls the tuning of each oscillator portion to each desired frequency.

19. A radio receiver as defined in claim 14 in which a piezo electric crystal controls the tuning of each oscillator portion to each desired frequency.

20. A radio receiver comprising first and second frequency converters, a first set of semi-fixed coils which are adapted to be selectively switched to tune the input of the first converter to accept different frequency ranges, a first set of semi-fixed condensers which are adapted to be selectively switched to tune the input of the first converter to accept different frequency bands within a selected range, a second set of semi-fixed coils which are adapted to be selectively switched to tune the oscillator portion of the first converter to a frequency such that the latter will mix with each different frequency range applied to the converter input to produce the same range of intermediate frequencies, means for impressing said range of intermediate frequencies onto the input of the second converter, a third set of semi-fixed coils which are adapted to tune the oscillator portion of the second converter to a frequency which will mix with the range of intermediate frequencies to produce a band of frequencies of substantially constant width, adjacent ones of such bands containing a common frequency, means for selecting said common frequency, and means for demodulating, amplifying and reproducing said common frequency.

21. A radio receiver as defined in claim 20 wherein a switch controls the operation of corresponding coils of the first and second sets and another switch controls the operation of corresponding condensers and coils of the first set of condensers and third set of coils.

22. A radio receiver operated solely by selector means comprising a first set of selector means operable in steps of large orders of kilocycles and a second set of selector means operable in steps of small orders of kilocycles, means including a first converter network under the frequency-determining control of the selective operation of any one of the first set of selector means and a wide band-pass filter coupled to said network for defining a wide order of the frequencies to be received, a second converter network under the frequency-determining control of the selective operation of any one of the second set of selector means, and a narrow band-pass filter coupled to said converter network for defining a narrow order of the frequencies to be received, whereby the frequency desired to be received is determined by the operation of one of the first set of selector means and one of the second set of selector means.

23. A triple conversion superheterodyne radio receiver circuit comprising a first oscillator tunable in steps of one megacycle, a second oscillator tunable in steps of 100 kilocycles, and a third oscillator tunable in steps of 10 kilocycles, a plurality of selective switches for controlling the tuning of each of said oscillators, said oscillators forming portions respectively of cascaded first, second and third frequency converter networks, first, second and third intermediate frequency band-pass filter circuits coupled to said frequency converter networks, in which the first intermediate frequency circuit passing a band of frequencies 1 megacycle wide, the second intermediate frequency circuit passing a band of frequencies 100 kilocycles wide and the third intermediate frequency circuit passing a band of frequencies 10 kilocycles wide.

24. A radio circuit as defined in claim 23 in which the first intermediate frequency circuit passes a band of frequencies 1 megacycle wide from 25 to 26 megacycles, the second intermediate frequency circuit passes a band of frequencies 100 kilocycles wide from 3,490 kilocycles to 3,580 kilocycles, and the third intermediate frequency circuit passes a band of frequencies 10 kilocycles wide from 255 kilocycles to 265 kilocycles.

25. A superheterodyne radio receiving circuit having at least two frequency conversion cascaded stages, comprising a tuned input circuit coupled to the input of the first of said stages, an intermediate frequency amplifier coupled to the output of the first of said stages and tuned to at least twice the highest frequency of any desired incoming signal, a first oscillator tunable in steps of 100 kilocycles coupled to said first stage, means for tuning said oscollator and for simultaneously tuning said input circuit in steps of 100 kilocycles, a second intermediate frequency amplifier coupled to the output of the second of said stages and tuned to a frequency not higher than one-half the frequency of lowest incoming desired signal, a second ocsillator coupled to said second stage and tunable in steps of 10 kilocycles, and means for tuning said second oscillator and simultaneously tuning the first-mentioned input circuit in steps of 10 kilocycles.

26. A radio receiver comprising first and second frequency converters each having an input circuit, and respectively including first and second oscillators, a first set of selectively operated reactances each of which is adapted to tune the input circuit of the first converter to accept a different frequency range, a second set of selectively operated reactances each of which is adapted to tune the input circuit of the first converter to accept a different band within the frequency range selected by said first set, a third set of selectively operated reactances each of which is adapted to tune the first oscillator to a frequency which will mix with each different frequency range applied to the converter input circuit to produce the same range of intermediate frequencies including one band within the range which is accentuated, coupling means for impressing said accentuated band of intermediate frequency on to the input circuit of the second converter, a fourth set of selectively operated reactances, each of which is adapted to tune the coupling means within the range of intermediate frequencies and particularly to the accentuated band of intermediate frequency, a fifth set of selectively operated reactances each of which is adapted to tune the second oscillator to a frequency which will mix with the accentuated band of intermediate frequency in the second converter to produce a common frequency, means for selecting said common frequency, and means for demodulating, amplifying and reproducing said common frequency.

27. In combination, means tunable in steps for selecting any one of a plurality of wide bands of frequencies within a broadcast band and converting it to a first intermediate frequency wide band which is the same for all of said wide bands, a narrow band-pass filter, a converter intercoupling said means and said filter, and means for controlling the frequency of said converter in steps to shift the second intermediate frequency output of said converter relative to the narrow-band pass of said filter, whereby any one of a plurality of narrow channels within the selected wide band is selected by said filter depending on the extent of such shift.

28. The combination of a variably tuned first converter stage for effecting a first order of selection from among a band of frequencies, a second converter stage, means for tuning said second stage in steps, and a band-pass filter coupled to said second stage for effecting a second or channel order of selection from among said band of frequencies, said second converter shifting its output frequencies in accordance with the channel to be selected.

JOHN DRYSDALE REID.

REFERENCES CITED

The following references are of record in the file of this patent:

UNITED STATES PATENTS

| Number | Name | Date |
|---|---|---|
| 2,115,676 | Wheeler | Apr. 26, 1938 |
| 2,150,562 | Reid | Mar. 14, 1939 |
| 2,186,068 | Hammond et al. | Jan. 9, 1940 |
| 2,209,959 | Chittick et al. | Aug. 6, 1940 |
| 2,231,634 | Monk | Feb. 11, 1941 |
| 2,245,385 | Carlson | June 10, 1941 |
| 2,282,974 | Koch | May 12, 1942 |
| 2,354,749 | Griffin | Aug. 1, 1944 |

FOREIGN PATENTS

| Number | Country | Date |
|---|---|---|
| 844,499 | France | Apr. 24, 1939 |

Certificate of Correction

Patent No. 2,507,576 May 16, 1950

JOHN DRYSDALE REID

It is hereby certified that errors appear in the printed specification of the above numbered patent requiring correction as follows:

Column 4, line 15, beginning with the words "one of" strike out all to and including "carrier-fre-" in line 19, and insert the same after "connect" in line 21, same column; column 7, lines 68 and 69, for "frequencies" read *frequency*; column 11, line 39, for "converted" read *converter*;

and that the said Letters Patent should be read with these corrections therein that the same may conform to the record of the case in the Patent Office.

Signed and sealed this 15th day of August, A. D. 1950.

[SEAL]

THOMAS F. MURPHY,
*Assistant Commissioner of Patents.*